US 6,623,333 B1

(12) United States Patent
Patel et al.

(10) Patent No.: US 6,623,333 B1
(45) Date of Patent: Sep. 23, 2003

(54) SYSTEM AND METHOD FOR CONTROLLING A WAFER POLISHING PROCESS

(75) Inventors: Nital S. Patel, Plano, TX (US); Gregory A. Miller, Richardson, TX (US); Christopher D. Guinn, Allen, TX (US); Adriana Sanchez, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 181 days.

(21) Appl. No.: 09/711,004

(22) Filed: Nov. 9, 2000

Related U.S. Application Data

(60) Provisional application No. 60/170,748, filed on Dec. 14, 1999.

(51) Int. Cl.[7] .................................................. B24B 1/00
(52) U.S. Cl. ............................. 451/9; 451/10; 451/41; 451/285; 451/287
(58) Field of Search ............................... 451/9, 10, 11, 451/5, 6, 41, 285, 287, 288, 63

(56) References Cited

U.S. PATENT DOCUMENTS 5,695,601 A * 12/1997 Kodera et al. ............ 156/636.1
6,254,457 B1 * 7/2001 Perrin et al. ................ 451/41
6,301,006 B1 * 10/2001 Doan ......................... 356/381
6,361,647 B1 * 3/2002 Halley ....................... 156/345
6,364,742 B1 * 4/2002 Fukuzawa ..................... 451/5

OTHER PUBLICATIONS

Patel, Nital S., et al., "Device Dependent Control of Chemical–Mechanical Polishing of Dielectric Films," *IEEE Transactions on Semiconductor Manufacturing*, vol. 13, No. 3, Aug. 2000, pp. 331–343.

* cited by examiner

*Primary Examiner*—Eileen P. Morgan
(74) *Attorney, Agent, or Firm*—Peter K. McLarty; W. James Brady, III; Frederick J. Telecky, Jr.

(57) ABSTRACT

A method is provided for controlling a wafer polishing process. The method includes determining a polishing characteristic for a particular type of device from a set of measurements obtained from a wafer having a device of the particular type, and updating the polishing characteristic in response to polishing and measuring a wafer having a device of the particular type. The method further includes determining the polish rate of a polisher using a set of measurements obtained from a wafer polished on the polisher; and updating the polish rate of the polisher in response to polishing a wafer on the polisher and measuring the wafer. The method also includes determining a desired polishing time on the polisher for a wafer having a device of the particular type using the updated polishing characteristic of the device and the updated polish rate of the polisher.

16 Claims, 2 Drawing Sheets

SYSTEM AND METHOD FOR CONTROLLING A WAFER POLISHING PROCESS

This application claims priority under 35 USC §119(e)(1) of provisional application No. 60/170,748 filed Dec. 14, 1999.

TECHNICAL FIELD OF THE INVENTION

This invention relates generally to the field of semiconductor wafer fabrication, and more specifically to a system and method for controlling a wafer polishing process.

BACKGROUND OF THE INVENTION

At various stages during the fabrication of integrated circuits on a semiconductor wafer it is necessary to polish the surface of the wafer. The surface of the wafer is polished to remove areas of high topography and surface defects. The polishing process often involves the introduction of a chemical slurry to increase removal rates and to allow selective removal of certain materials. A polishing process using such a slurry is typically referred to as chemical mechanical polishing (CMP). In the CMP process, the wafer to be polished is affixed to a wafer carrier, and pressed face-down on a rotating platen holding a polishing pad. The slurry, which contains abrasive material, is dripped onto the rotating platen during polishing. The process removes material at the surface of the wafer through a combination of mechanical and chemical action.

The CMP process is subject to variation due to drifts in the polish rate of a polisher over time (caused by wearing of the polishing pad and other factors) and due to varying device characteristics. The latter is caused by differing device layouts (e.g., differing surface designs of fabricated or semi-fabricated wafers), which results in different devices having different apparent polish rates. Because of the accuracy required when manufacturing devices such as integrated circuits, it is necessary to determine the exact amount of time required to polish a layer of a wafer to a desired thickness. However, because of the variations described above, it is difficult to obtain exact polishing times.

SUMMARY OF THE INVENTION

In accordance with the present invention, a system and method for controlling a wafer polishing process are provided that substantially eliminate or reduce disadvantages or problems associated with previously developed systems and methods. In particular, the present invention contemplates a control system that simultaneously tracks the polishing characteristics of various device groups across a number of polishers and the polish rate of each polisher.

In one embodiment of the present invention, a method is provided for controlling a wafer polishing process. The method includes determining a polishing characteristic for a particular type of device from a set of measurements obtained from a wafer having a device of the particular type, and updating the polishing characteristic in response to polishing and measuring a wafer having a device of the particular type. The method further includes determining the polish rate of a polisher using a set of measurements obtained from a wafer polished on the polisher; and updating the polish rate of the polisher in response to polishing a wafer on the polisher and measuring the wafer. The method also includes determining a desired polishing time on the polisher for a wafer having a device of the particular type using the updated polishing characteristic of the device and the updated polish rate of the polisher.

In another embodiment of the present invention, a system for controlling wafer polishing is provided that includes a number of polishers that are operable to polish wafers of different device types. The system further includes a number of metrology units that are operable to obtain measurements of a wafer. The system also includes a central control unit that is operable to receive the measurements obtained from the metrology units. The central control unit is further operable to use the measurements obtained from the wafers of a particular device type polished on any of the polishers to determine a polishing characteristic of the device type, and to use the measurements obtained from wafers polished on a particular polisher to determine a polish rate for the polisher.

Technical advantages of the present invention include a system and method for controlling a wafer polishing process that track both polishing characteristics of the different device groups being polished and the polish rate (and change in polish rate) of each of the polishers being used. In one embodiment of the present invention, a local controller is used to track the polish rate of each polisher, and a centralized controller is used to track device characteristics. A key advantage of separating out the device-dependent effects from the polish rate is that lookahead polishes for a new device can be run on one polisher, and the remaining wafers can then be run on a different polisher. Formerly, the polisher had to sit idle while the lookahead was cleaned and measured. The rest of the lot was then allowed to run on the same tool. This idle time is eliminated since the lookahead can run on a different polisher than the rest of the lot.

In addition, the present system and method provide a calculation of the polishing time required for a particular device that is substantially independent of the number of lookaheads that are performed for the device. Furthermore, this calculation explicitly accounts for variation in the thickness of incoming wafers in a device group, and also accounts for errors in the calculated polishing time due to wafer cleaning and measurement delays. The present system and method may also be used with either on-line or off-line metrology (measurement). Other technical advantages are readily apparent to one skilled in the art from the following figures, descriptions and claims.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

The present invention provides a control system for controlling the average post-polish thickness for pre-metal, inter-metal dielectric, and other types of films on semiconductor wafers. The control system calculates the required polishing time for a particular device (a particular configuration of components on a fabricated or semi-fabricated wafer) by accounting for the both the polish rate of various polishers and the characteristics of the various devices to be polished. In some embodiments, filtering may be employed to prevent targeting errors, due to unlearnt device characteristics, from throwing off subsequent lots. The variation in thickness of incoming devices may also be accounted for in the control system. Furthermore, other incoming variations may accounted for, such as pattern size and film density. By separating out the device-dependent effects from the polish rate, lookaheads (sample runs) for a new device can be run on one polisher, and the remaining wafers can then be run on a different polisher. Formerly, the polisher had to sit idle while the lookahead wafer was cleaned and measured, then the rest of the lot was allowed to run on the same tool.

Figure 1:
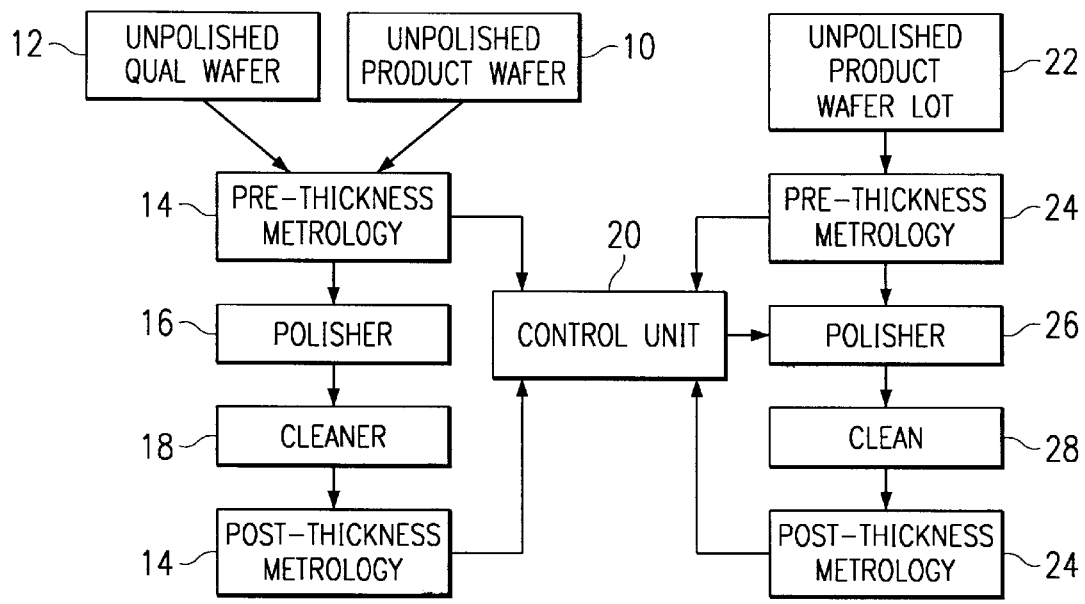
FIG. 1 illustrates a process flow associated with one embodiment of the present invention.

FIG. 1 illustrates a process flow associated with one embodiment of the present invention. When a new device is to be polished, the device goes through a lookahead polishing process wherein a product wafer 10 and a qual (or blanket) wafer 12 are simultaneously polished. This lookahead process is utilized to obtain information that is used to determine a desired polishing time for a wafer of a particular device.

Qual wafer 12 is typically a wafer having a uniform layer of oxide (or other material to be polished) on its surface. Since the layer to be polished is uniform (e.g., has a level topography), the polish rate should be constant. Therefore, qual wafer 12 is used to obtain a device-independent polish rate of a polisher. Before product wafer 10 and qual wafer 12 are polished, a pre-polishing thickness measurement (or pre-thickness) is taken for both wafers 10, 12 at a metrology tool 14. The wafers are then simultaneously polished at a polisher 16. After polishing, wafers 10, 12 are cleaned at a cleaner 18, and a post-polishing thickness measurement (or post-thickness) is taken for both wafers 10, 12 at metrology tool 14 (or any other available metrology tool). This completes the lookahead polishing process. The pre- and post-thickness measurements for both wafers 10, 12 are sent to a control unit 20, which assembles information about polisher 16 and the device represented by product wafer 12. Control unit 20 uses the metrology information obtained from the lookahead polish of wafers 10, 12 to determine a preliminary polishing time required for the product wafer lot. As will be described below, the method of calculating the polishing time for a particular device on a particular polisher is based on device characteristics learned from the lookahead (which are updated as subsequent product lots of the device are polished) and the polishing rate for the particular polisher at a particular instant (which is also learned from lookaheads and product lot polishes).

After the lookahead polish is complete, the remaining product lot 22 is polished. A pre-polishing thickness measurement is taken for one or more wafers in lot 22 at a metrology tool 24. The wafers are then polished at a polisher 26 for a length of time determined by control unit 20 according to the calculations of the present invention, described below. After polishing, the wafers are cleaned at a cleaner 28, and a post-polishing thickness measurement is taken for one or more wafers in lot 22 at metrology tool 24 (or any other available metrology tool). As with wafers 10, 12, the pre- and post-thickness measurements for the wafers of lot 22 are sent to a control unit 20 that assembles information about polisher 26 and the device represented by product wafer lot 22.

Control unit 20 uses the metrology information obtained from the polish of lot 22 to determine the polishing time required for subsequent wafer lots of the same device. For the first few lots of a device, a lookahead polish is performed before each lot is polished. Once several lots of a given device have been run, control unit 20 has sufficient data to precisely determine the required polishing time, and the lookahead polishing procedure is no longer used. Additional lots skip the lookahead step and proceed directly to lot polish. This results in cycle time savings due to the time saved in not running lookaheads.

Metrology tools 14, 24 may be either separate from or integrated with a polisher. A metrology tool separate from a polisher may be referred to as off-line metrology, and a metrology tool integrated into a polisher may be referred to as on-line metrology. With off-line metrology, the polished wafers have to be cleaned before they can be measured, and thus there is significant metrology delay. Off-line metrology thus reduces the number of wafer measurements that may be taken per lot (due to cycle time constraints). However, as described below, the present invention accounts and compensates for the delay between polishing and post-thickness measurement. In the case of on-line metrology, the wafers can be measured immediately after polishing. Therefore, if on-line metrology is used, every wafer in the lot can be pre- and post-measured, with each wafer being polished for a different time period (the time period being refined between the polishing of each wafer by a control unit). The control system described in this application may also be used with on-line metrology (where lookaheads are performed for every lot and every wafer in a given lot is measured).

Figure 2A:
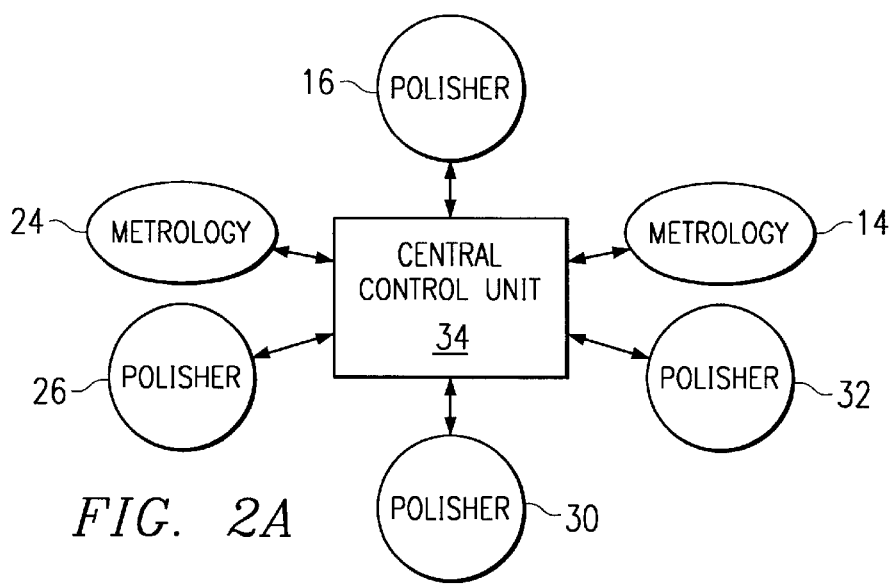
FIG. 2A illustrates an embodiment of the present invention implementing off-line metrology.
Figure 2B:
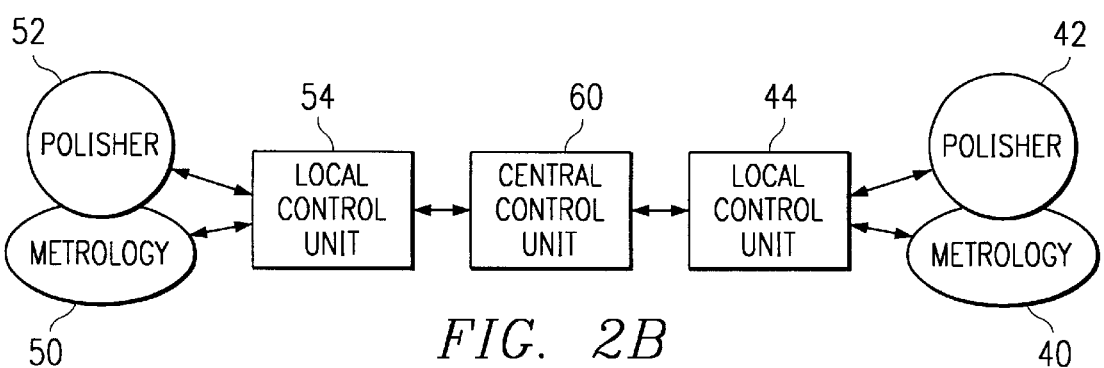
FIG. 2B illustrates an embodiment of the present invention implementing on-line metrology.

FIGS. 2A and 2B illustrate exemplary architectures for embodiments implementing off-line and on-line metrology, respectively. In the case of off-line metrology (FIG. 2A), each polisher 16, 26, 30, 32 and each metrology tool 14, 24 communicate with a central control unit 34. Control unit 34 (which is analogous to control unit 20) uses the metrology data to determine a polishing time for each device on each polisher 16, 26, 30, 32, as described below, and sends the associated polishing times to each polisher 16, 26, 30, 32. Any suitable number of metrology tools and polishers may be used.

In the case on-line metrology (FIG. 2B), a metrology tool 40, 50 is integrated with each polisher 42, 52, respectively. Any number of polisher/metrology tool sets may be implemented. Each polisher/metrology tool set has an associated local control unit 44, 54. Local control units 44, 54 determine information about each device and about their respective polisher 42, 52. Local control units 44, 54 then send information about each device to a central control unit 60, which then sends this information to all the polishers 42, 52. Thus, the combination of local control units 44, 54 and central control unit 60 is analogous to control unit 34. By allowing each local control unit 44, 54 to determine and share the polishing characteristics of a particular device, this information is not biased due to the polishing characteristics of any one polisher 42, 52. In addition, the same information need not be learnt repeatedly on all polishers 42, 52. Local control units 44, 54 track the drift in polish rate at their respective polishers 42, 52, since this drift is unique to each polisher. Central control unit 60 uses the device-specific information (e.g., the time required to polish a particular device to a particular thickness) and polisher-specific information (e.g., the polish rate of a polisher at a particular instant) to determine a required polishing time for a particular device on a particular polisher at a particular instant using the control procedure described below.

Figure 3:
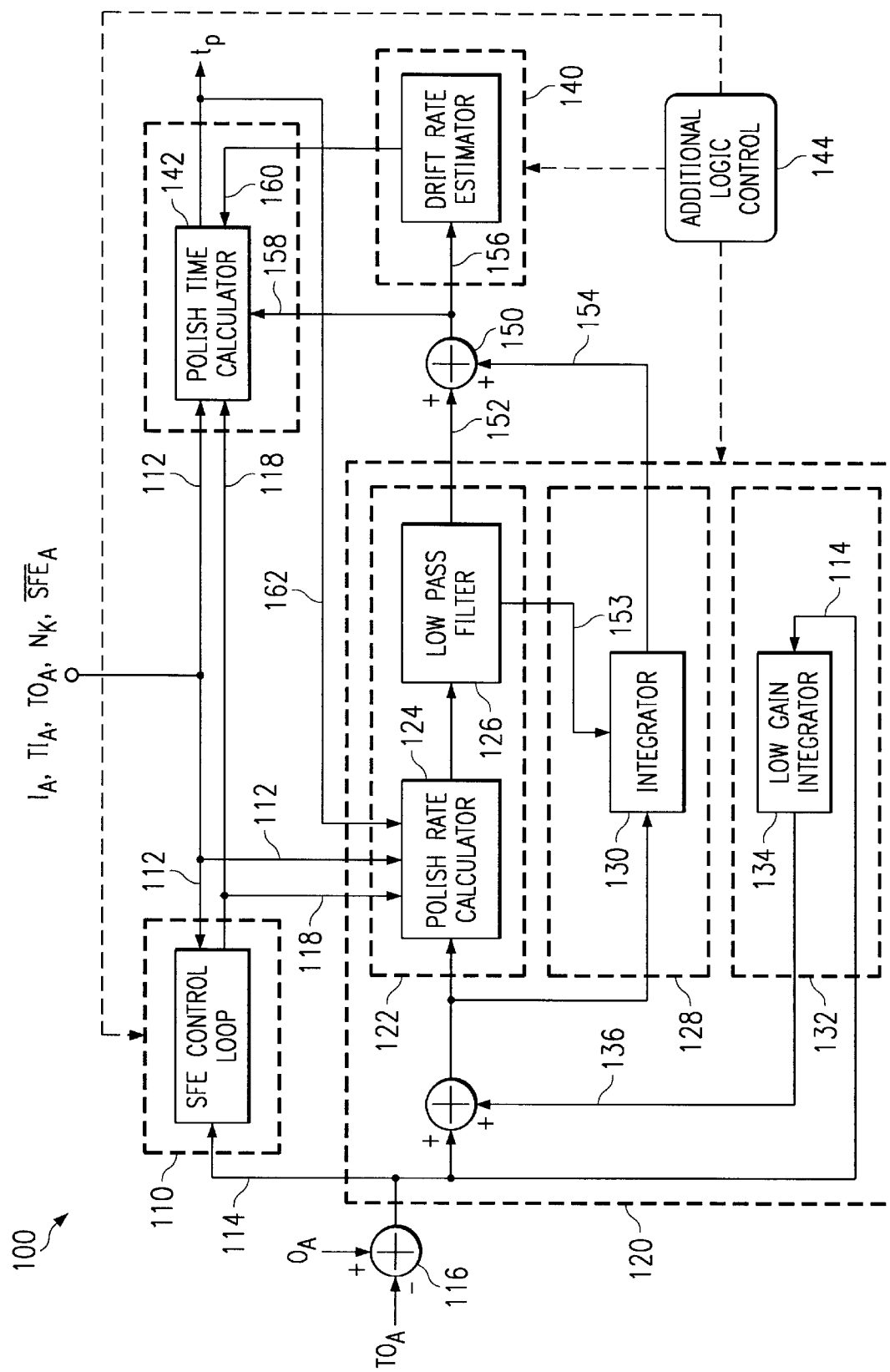
FIG. 3 illustrates a control system according to teachings of the present invention.

FIG. 3 illustrates a control system 100 according to one embodiment of the present invention. Control system 100 forms a portion of control units 20, 34, 44, 54, 60 and operates to calculate a polishing time for a wafer of a particular device on a particular polisher based on both the characteristics of the device and the polishing rate of the polisher. Since the present invention can track both the characteristics of various devices and the polishing rate of various polishers, the present invention can be used to determine the polishing time required to polish a wafer of any of the devices on any of the polishers at a particular instant. Therefore, wafers of a particular device can be polished on a number of different polishers, and the polishing process is not delayed due to wafers waiting to be polished on a particular polisher.

Control system 100 implements a sheet film equivalent control loop 110, a polish rate tracking loop 120, a drift rate estimator 140, and a polish time calculator 142 to determine the polish time required for a particular device on a particular polisher. Each of these components, and their associated equations, are described in detail below. In all of these equations, the following notations are used to indicate pre and post-thickness data for a particular device type "A". The reference pre-polish thickness (target pre-thickness) is denoted by $TI_A$. The reference post-polish thickness (target post-thickness) is denoted by $TO_A$. The measured pre-polish thickness (pre-thickness) is denoted by $I_A$, and the measured post-polish thickness (post-thickness) is denoted by $O_A$.

Sheet Film Equivalent Control Loop 110

The concept of a sheet film equivalent (SFE) is used to represent polishing characteristics for each device in the present control system. The SFE of a device A (denoted by $SFE_A$), is the amount of material removed off a qual wafer in the time required to polish the product wafer from a target pre-thickness ($TI_A$) to a target post-thickness ($TO_A$). In order to correctly determine the polishing time for numerous devices, an equivalent SFE may be estimated based on the qual wafer polish rate. Given a device with $SFE_A$, $TI_A$, $TO_A$, $I_A$, $I_O$, and the time $t_F$ that the wafer was polished, the equivalent sheet film removal amount is computed as:

$$\Delta SFE = SFE_A + I_A - TI_A + TO_A - O_A \tag{1}$$

Alternatively, Equation (1) could be written in general form as:

$$\Delta SFE = SFE_A + \sum_{i=1}^{n} f^i(I_A^i, TI_A^i) + f^{n+1}(TO_A, O_A)$$

to include other types of incoming disturbances besides pre-polish thickness. These disturbances could include variables such as the pattern size and the film density, among others. The function $f^i$ accounts for various types of incoming disturbances where i represents the various disturbances. The function $f^{n+1}$ accounts for the difference between the target and actual post-polishing thicknesses. Whereas Equation (1) is a linear function, the functions $f^i$ and $f^{n+1}$ may be non-linear functions. All of the other equations described in this application may also be rewritten in this general form.

Using the incoming thickness (Equation (1)) as the incoming disturbance for exemplary purposes hereafter, the polish rate (r), as measured off the product wafer is:

$$r = \frac{\Delta SFE}{t_p} \tag{2}$$

Note that since $I_a - TI_a$ and $O_A - TO_A$ are typically small, any error in the estimation of Equation (2) will be small.

In order to determine $SFE_A$, the following equation is used:

$$SFE_A = \overline{SFE}_A + \delta SFE_A$$

where $\overline{SFE}_A$ is the default SFE value, and $\delta SFE_A$ is a component that is updated based on incoming process data. This component is updated primarily via an integrator (discrete time) as follows:

$$\delta SFE_A[k+1] = \delta SFE_A[k] + g_{I,O_A[k]-TO_A} \cdot (O_A[k] - TO_A - \overline{SFE}_A + SFE_A[k - \tau_A] - \delta SFE_A[k]) \tag{3}$$

where $SFE_A[K]$ is the SFE for a particular lot of device A wafers (or the SFE for a particular wafer if each wafer is measured using on-line metrology) and $\delta SFE_A[0]=0$. $\tau_A$ denotes the number of lots (or other appropriate metrology sample size—a single wafer in the case of on-line metrology) polished between the start of the lot polish and the completion of metrology for a particular lot. Equation (3) explicitly accounts for this delay and prevents the control loop from losing stability. The update gain ($g_{I,O_A[k]-TO_A}$) is a function of the post-thickness error (the difference between the measured post-thickness and the target post-thickness) and is chosen to provide reduced correction on under-polishes (since these are expected with fast polish rate declines, for example due to conditioning disk wear-out). An example of a typical $g_{I,O_A[k]-TO_A}$ function is $$g_{1,O_A[k]-TO_A} = \begin{cases} c_1 & \text{if } O_A[k-\tau_A] - TO_A \leq M_1 \\ \alpha c_1 & \text{if } O_A[k-\tau_A] - TO_A > M_1 \end{cases}$$

where c is a constant, $0<\alpha<1$, and $M_1$ is the under-polish limit for triggering gain reduction.

Lookaheads are typically used to find an initial value of $\delta SFE_A$. As described above, a lookahead involves simultaneously polishing one wafer of device group A and a qual wafer. Given the initial and final thicknesses ($I_A$ and $O_A$) of the product wafer and the initial and final thicknesses of the qual wafer ($I_Q$ and $O_Q$), the value for $\delta SFE_A$ can be computed via two methods:

$$\delta SFE_A = I_Q - O_Q + O_A - TO_A - (I_A - TI_A) - \overline{SFE}_A.$$

or $$\delta SFE_A = O_A - TO_A + SFE_A - \overline{SFE}_A.$$

The former is based on the qual wafer data and is independent of any polish rate estimate errors, whereas the latter is based on product data only and is independent of the qual wafer data. In practice, a weighted sum of the two is chosen to minimize the impact of rate estimation errors and poor qual wafer quality:

$$\delta SFE_A = w(I_Q - O_Q + O_A - TO_A - (I_A - TI_A)) + (1-w)(O_A - TO_A + SFE_A) - \overline{SFE}_A \tag{4}$$

where $0<w<1$ is the weighting factor. The role of the lookahead is to provide a starting value for $\delta SFE_a$, which is then refined using Equation (3). In the case of multiple lookaheads, the values of $\delta SFE_A$ are averaged. Also, in order to speed up convergence in equation (3), Statistical Process Control (Western Electric Company) rules may be incorporated for resetting $\delta SFE_A$.

An SFE control loop 110, as described above, is incorporated into control system 100 as shown in FIG. 3. Incoming measurement parameters (e.g., $TI_A$, $TO_A$, $I_A$, $I_O$, $N_K$, $\overline{SFE}_A$), indicated by arrow 112, are input to SFE loop 110 from various metrology units. In addition, the post-thickness error ($O_A - TO_A$), determined by post-thickness error calculator 116, is input to SFE loop 110, as indicated by arrow 114. Each time the value $\delta SFE_A$ is updated, the updated value is sent to a polish rate tracking loop 120, as indicated by arrow 118, that calculates an estimated rate at which a particular polisher is polishing, as described below.

Polish Rate Tracking Loop 120

In order to track the polish rates of various polishers, polish rate tracking loop 120 is used. Polish rate tracking loop 120 utilizes the polish rate obtained from the product wafer metrology data (Equation (2)) and data from qual wafer polish runs to determine these polish rates. In order to maintain consistency, Equation (2) is also be used to obtain polish rate estimates for qual wafers. For this purpose, the sheet film equivalent of a qual wafer ($SFE_Q$) is defined as follows:

$$SFE_Q = TI_Q - TO_Q \quad (5)$$

where $TI_Q$ and $TO_Q$ are the target pre and post-thicknesses, respectively, of the qual wafer. For this case, denoting $I_Q$ and $O_Q$ as the actual pre and post-thicknesses, and employing Equations (1) and (2), the following expression is obtained:

$$r = \frac{I_Q - O_Q}{t_p} \quad (6)$$

which yields the qual polish rate. Thus, both qual and product wafers are treated in a uniform fashion, except for the fact that the value of $SFE_O$ is frozen (the value from Equation (5)).

As described above, the time required to polish a particular device depends on device-specific characteristics (SFE) and polisher-specific characteristics (polish rate and polish rate drift). The following preliminary equations may be utilized to determine the polish rate based on polisher-specific characteristics and a given value of SFE, but do not account for updating values of SFE (e.g., it is assumed the SFE values are frozen in time). The preliminary equations will be later modified to account for updating SFE values. Control system 100 is designed using an inner loop 122 that tracks the filtered effective polishing time for device A, and an outer loop 128 that uses integral action to eliminate tracking errors in inner loop 122. For unchanging values of $SFE_A$, inner loop 122 is given by:

$$x_1[k+1] = x_1[k] + m_1(\gamma[k] - x_1[k] - x_2[k]) \quad (7)$$

$$x_2[k+1] = m_2 x_2[k] + m_3(\gamma[k] - x_1[k] - x_2[k])$$

$$\gamma[k] = \frac{t_p[k]M}{\Delta SFE[k]}$$

where $\Delta SFE[k]$ is computed using Equation (1). M is the number of Angstroms to be removed from each wafer, $m_i$, where i=1, 2, . . . are controller coefficients (used to determine controller behavior), and $t_p$ is the polishing time.

For unchanging values of $SFE_a$, outer loop 128 is given by:

$$x_3[k+1] = x_3[k] + m_4(x_1[k] + x_2[k] + x_3[k])(O_A[k] - TO_A[k])/M \quad (8)$$

where $(x_1[k]+x_2[k]+x_3[k])/M$ is the estimated inverse of the polish rate. Let $x_1[k]+x_2[k]+x_3[k]$ be referred to as the effective polishing time, $t_E[k]$. Equation (8) acts as an integrator 130 which works off the post-thickness error, whereas Equation (7) represents a second order filter that estimates the polish rate. Since the effective polish time drifts (or ramps), inner loop 122 will lag in its estimate of the required polish time. Outer loop 128 serves to remove this lag.

Given the estimated effective time, the polish time ($t_F$) for a particular lot of wafers of device A can be computed via the following equation:

$$t_p[k] = \frac{x_1[k] + x_2[k] + x_3[k]}{M}(SFE_A[k] + I_A[k] - TI_A[k]). \quad (9)$$

Alternatively, equation (9) may be generalized to yield:

$$t_p[k] = \frac{x_1[k] + x_2[k] + x_3[k]}{M}\left(SFE_A[k] + \sum_{i=1}^{n} f^i(I_A^i[k], TI_A^i[k])\right)$$

to include other types of incoming disturbances besides pre-polish thickness. As described above in conjunction with Equation (1), these disturbances could include variables such as the pattern size and the film density, among others. The function $f^i$ accounts for various types of incoming disturbances where i represents the various disturbances. Whereas Equation (1) is a linear function, the function $f^i$ may be a non-linear function.

Updated Polish Time Control System

The control equations presented above work well where the $SFE_A$ values are frozen; however, once $SFE_A$ is allowed to be updated (using Equation (3)), there is a need for additional compensation. This additional compensation is needed due to the fact that (i) both the $SFE_A$ and $t_E$ are updated off the same post-thickness error, and (ii) $SFE_A$ is used to compute the update for $t_E$. Due to (i), a part of the error in tracking the effective polishing time affects SFE loop 110. This then causes additional error in tracking the effective polishing time due to (ii).

In order to resolve the errors caused by updating the value of $SFE_A$, an update loop 132 needs to be incorporated into the feedback system. Update loop 132 feeds back the post-thickness error, using a low gain integrator 134, to inner loop 122 and outer loop 128, as indicated by arrow 136. With update loop 132 in place (and factoring in the case of lookaheads), equations (7) and (8) are modified as follows:

$$\begin{aligned}
x_1[k+1] &= x_1[k] + m_1(\gamma[k] - x_1[k] - x_2[k]) \\
x_2[k+1] &= m_2 x_2[k] + m_3(\gamma[k] - x_1[k] - x_2[k]) \\
\gamma[k] &= \frac{t_p[k]M}{c_{LA}(I_Q - O_Q) + (1 - c_{LA})(SFE_A[k] + I_A[k] - TI_A[k] + TO_A[k] - O_A[k] + x_4[k])} \\
x_3[k+1] &= x_3[k] + m_4(x_1[k] + x_2[k] + x_3[k])((-c_{LA})(O_A[k] - TO_A[k]) + x_4[k] + c_{LA}(O_Q[k] - I_Q[k] + SFE_A[k] + I_A[k] - TI_A[k]))/M \\
x_4[k+1] &= x_4[k] + m_5((1 - c_{LA})(O_A[k] - TO_A[k]) + c_{LA}(O_Q[k] - I_Q[k] + SFE_A[k] + I_A[k] - TI_A[k]))
\end{aligned} \quad (10)$$

where $c_{LA}=1$ if it is a lookahead polish, else $c_{LA}=0$.

For the lookahead case, $\gamma[k]$ is computed off the qual wafer polish with the product wafer, since the SFE value for the product is expected to be incorrect. Product and qual wafer measurements are used to obtain a point estimate of the polish rate using a polish rate calculator 124. Also, in case of $x_3$ and $x_4$, the update on lookaheads is based on the post-thickness error for the qual wafer, where the post-thickness target is set equal to the qual wafer pre-thickness minus the targeted qual removal amount ($SFE_A[k]+I_A[k]-TI_A[k]$). This added loop ensures that the control system behaves in a consistent manner and independently of the qual wafer frequency (how often a qual wafer is run).

Given the presence of metrology delays in practice, there is also a need to incorporate an estimator 140 for the effective polishing time drift rate. This proves useful in estimating the polish rate for the first few runs on a new polishing pad. In order to track this drift rate, two additional states are required. These states are updated as follows:

$$x_5[k+1]=x_1[k]+x_2[k]+x_3[k]x_6[k+1]=m_6x_6[k]+m_7(x_1[k]+x_2[k]+x_3[k]-x_5[k]). \quad (11)$$

Then, given the number of wafers that have been polished, but are yet to be measured (denoted by $N_k$), Equation (9) can be modified to:

$$t_p[k] = \frac{x_1[k]+x_2[k]+x_3[k]+N_k x_6[k]}{M}(SFE_A[k]+I_A[k]-TI_A[k]). \quad (12)$$

Equation (12) is incorporated into a polish rate calculator 142, which calculates the polish time, $t_p$, for a particular device on a particular polisher, and sends this calculated polish time to the polisher.

Using control system 100, the polish time for a device group A is thus calculated as follows. As described above, SFE loop 110 calculates $SFE_A$ based on pre-thickness and target measurements 112, as well as post-thickness error 114 (calculated from previous polish runs by post-thickness error calculator 116). The updated value for $SFE_A$ is sent to inner loop 122 which then outputs values for $x_1$ and $x_2$ to an adder 150, as indicated by arrow 152. In addition, inner loop 122 outputs the values of $x_1$ and $x_2$ to outer loop 128, as indicated by arrow 153. Outer loop 128 calculates the value of $x_3$ and sends its value to adder 150, as indicated by arrow 154. The calculations of $x_1$, $x_2$ and $x_3$ are affected by the value of $x_4$, which is determined by update loop 132 and output to inner and outer loops 122, 128, as indicated by arrow 136.

Adder 150 sums the values of $x_1$, $x_2$ and $x_3$ output by inner and outer loops 122, 128, respectively. This sum is then output to drift rate estimator 140, as indicated by arrow 156, and to polish time calculator 142, as indicated by arrow 158. Drift rate estimator 140 determines the value of $x_6$ using the sum of $x_1$, $x_2$ and $x_3$, and drift rate estimator 140 outputs this value of $x_6$ to polish time calculator 142, as indicated by arrow 160. Polish rate calculator 142 then determines the polish time, $t_p$, for device A using pre-thickness and target measurements, $N_K$, and $\overline{SFE}_A$ (112), $SFE_a$ (118), the sum of $x_1$, $x_2$ and $x_3$ (158), and $x_6$ (160). Polish time calculator 142 outputs this calculated polish time to the appropriate polisher for polishing of device A. Polish time calculator 142 also outputs this calculated polish time to inner loop 122, as indicated by arrow 162, for use in subsequent calculations.

In order to enhance control system 100, additional logic control 144 may be incorporated into control system 100 to (i) screen out invalid data points (e.g., by determining whether the measurements are within a selected range from previous measurements obtained form wafers of the same device), (ii) reset the various model states on a new pad or film type change, (iii) handle reworks (updates do not occur during reworks due to noisy rate data), (iv) reset the controller states, if so desired, through a password protected automation interface, (v) allow for piggy-backed quals, wherein a qual is polished with a production lot without requiring a separate run, resulting in higher tool utilization, and (vi) check to ensure that lots are measured in approximately the same sequence as they were polished. This logic is inserted as needed into control system 100.

Finally, although it has been assumed that all product wafers run off the same polish "recipe" (e.g. back-pressure, spin speed) for a given film type, scaling factors may be incorporated into the above equations to account for different recipes. For example, assume the control system was developed using the qual polish rate for recipe A as the reference rate, and suppose the qual polish rate for recipe B is β times this rate. Then for all wafers polished using recipe B, the polish time is 1/β the value of $t_p$ calculated using Equation (12). Equations (10) and (11) remain unchanged, as does SFE update loop 110 (Equation (3)). Typically, production recipes are created by trading-off several competing requirements (e.g. rate, uniformity, defects, pad life, chemical consumption etc.), and a very limited number of recipes are used.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for controlling a wafer polishing process, comprising:

determining a polishing characteristic for a particular type of device from a set of measurements obtained from a wafer having a device of the particular type;

updating the polishing characteristic in response to polishing and measuring a wafer having a device of the particular type;

determining the polish rate of a polisher using a set of measurements obtained from a wafer polished on the polisher;

updating the polish rate of the polisher in response to polishing a wafer on the polisher and measuring the wafer; and determining a desired polishing time on the polisher for a wafer having a device of the particular type using the updated polishing characteristic of the device and the updated polish rate of the polisher.

2. The method of claim 1, further comprising:

communicating the determined polishing time to polisher; and polishing the wafer, for which the polishing time was determined, on the polisher for a length of time substantially equal to the determined polishing time.

3. The method of claim 1, further comprising initially determining the polishing characteristic for a particular type of device using a set of measurements obtained from a lookahead polish wherein a wafer having a device of the particular type and a qual wafer are polished substantially simultaneously on a polisher.

4. The method of claim 3, wherein the lookahead polish is performed on a different polisher than the polisher for which the required polishing time is determined.

5. The method of claim 1, wherein determining a desired polishing time on the polisher for a wafer having a device of the particular type further comprises:

determining the rate of decline of the polish rate for the polisher over a selected period of time; and using the rate of decline of the polish rate in the determination of the desired polishing time to account for errors in the updated polish rate of the polisher caused by delays in obtaining sets of measurements from the wafers polished on the polisher.

6. The method of claim 1, wherein determining a desired polishing time on the polisher for a wafer having a device of the particular type further comprises:

determining an incoming thickness error comprising the difference between an actual pre-polishing thickness and a target pre-polishing thickness of the wafer used to update the polishing characteristics of the device; and using the incoming thickness error in the determination of the required polishing time to account for variation in the pre-polishing thickness of the wafer used to update the polishing characteristics of the device.

7. The method of claim 1, wherein the set of measurements obtained from a wafer comprises the actual pre-polishing thickness of the wafers, the target pre-polishing thickness of the wafers, the actual post-polishing thickness of the wafers, and the target post-polishing thickness of the wafers.

8. The method of claim 1, determining a polishing characteristic for a particular type of device comprises determining the sheet film equivalent of the device.

9. The method of claim 1, wherein updating the polishing characteristic comprises updating the sheet film equivalent of the device.

10. The method of claim 1, further comprising:

evaluating the set of measurements obtained from a wafer to determine the validity of the set of measurements; and using the set of measurements to update the polishing characteristic for a device only if the set of measurements are valid.

11. The method of claim 10, wherein evaluating the set of measurements obtained from a wafer comprises determining whether the measurements are within a selected range from previous measurements obtained form wafers having a device of the same type.

12. The method of claim 1, further comprising:

determining whether sequential sets of measurements obtained from the wafers were obtained from wafers that were substantially sequentially polished; and using a particular set of measurements to update the polishing characteristics of a device only if the sequential sets of measurements obtained from the wafers were obtained from wafers that were substantially sequentially polished.

13. A system for controlling wafer polishing, comprising:

a plurality of polishers, each polisher operable to polish a plurality of wafers of different device types;

a metrology unit associated with each polisher and operable to obtain measurements of the wafers polished by the polisher;

a local control unit associated with each polisher and operable to receive the measurements obtained from the metrology unit associated with the polisher, and further operable to use the measurements to determine a polish rate for the polisher, and to use the measurements obtained from wafers of a particular device type to determine a polishing characteristic of the device type; and a central control unit operable to receive the polishing characteristic of a device type determined by the local control units, further operable to update the polishing characteristic of the device type using the polishing characteristic of the device type determined by each local control unit, and further operable to distribute the updated polishing characteristic to each local control unit.

14. The system of claim 13, wherein each local control unit is further operable to determine the time required to polish a wafer of a particular device type on the associated polisher using the updated polishing characteristic of the device type and the polish rate of the polisher.

15. The system of claim 14, wherein the local control unit is further operable to distribute the determined polish time to the associated polisher for use in polishing the wafer.

16. The system of claim 13, wherein the measurements obtained from a wafer by the metrology units comprise the actual pre-polishing thickness of the wafer, the target pre-polishing thickness of the wafer, the actual post-polishing thickness of the wafer, and the target post-polishing thickness of the wafer.

* * * * *